(12) United States Patent
Suzuki et al.

(10) Patent No.: US 6,479,836 B1
(45) Date of Patent: Nov. 12, 2002

(54) SEMICONDUCTOR LIGHT EMITTING DEVICE

(75) Inventors: Nobuhiro Suzuki, Tokyo-To; Hideto Sugawara, Kawasaki, both of (JP)

(73) Assignee: Kabushiki Kaisha Toshiba (JP)

( * ) Notice: Subject to any disclaimer, the term of this patent is extended or adjusted under 35 U.S.C. 154(b) by 59 days.

(21) Appl. No.: 09/641,215

(22) Filed: Aug. 18, 2000

(30) Foreign Application Priority Data

Aug. 19, 1999 (JP) .......................... 11-233009

(51) Int. Cl.$^7$ ............................... H01L 29/06
(52) U.S. Cl. .................. 257/15; 257/97; 257/103; 257/745
(58) Field of Search .............. 257/15, 21, 85, 257/94, 96, 97, 99, 103, 744, 745

(56) References Cited

U.S. PATENT DOCUMENTS

| | | | | |
|---|---|---|---|---|
| 5,488,233 A | * | 1/1996 | Ishikawa et al. .............. 257/4 |
| 5,786,603 A | * | 7/1998 | Rennie et al. ................ 257/13 |
| 5,874,747 A | * | 2/1999 | Redwing et al. .............. 257/77 |
| 6,005,258 A | | 12/1999 | Manabe et al. ................ 257/13 |
| 6,055,256 A | * | 4/2000 | Nakatsuka et al. ........... 372/46 |
| 6,087,725 A | * | 7/2000 | Yoshii et al. ................ 257/744 |
| 6,150,672 A | * | 11/2000 | Kaneko ........................ 257/94 |
| 6,172,382 B1 | * | 1/2001 | Nagahama et al. ........... 257/94 |
| 6,191,437 B1 | * | 2/2001 | Sonobe et al. ................ 257/94 |
| 6,242,761 B1 | * | 6/2001 | Fujimoto et al. ............. 257/94 |

FOREIGN PATENT DOCUMENTS

JP   04-122070   * 4/1992   .......... H01L/29/46

* cited by examiner

*Primary Examiner*—Sara Crane
(74) *Attorney, Agent, or Firm*—Gray Cary Ware & Freidenrich LLP

(57) ABSTRACT

According to the invention, there is provided a semiconductor light emitting device comprising: a contact layer formed of a nitride semiconductor; and a p-side electrode provided in contact with a surface of the contact layer, the contact layer having a superlattice including an alternative stacked structure of first nitride semiconductor layers having a wider bandgap and second nitride semiconductor layers having a narrower bandgap, the first semiconductor layers being selectively doped with a p-type dopant.

20 Claims, 7 Drawing Sheets

SEMICONDUCTOR LIGHT EMITTING DEVICE

BACKGROUND OF THE INVENTION

This invention relates to a semiconductor light emitting device, in particular to the semiconductor light emitting device made from a nitride semiconductor such as GaN, AlGaN, InGaN, InGaAlN and BInGaAlN which has a lower operating voltage compared to the conventional ones.

Light emitting devices such as a light emitting diode (LED) and a laser diode (LD) which are made of nitride semiconductor are expected to have a high luminous efficiency in a short wavelength region, since it is predicted that a nitride semiconductor such as BInGaAlN is expected to have a band structure of a direct transition-type over almost all the composition range.

It should be noted that the term "nitride semiconductor" as used in this application comprises semiconductors of compounds of groups III to V with the generic form of $B_x In_y Al_z Ga_{(1-x-y-z)}N$ (where $0 \leq x \leq 1$, $0 \leq y \leq 1$, and $0 \leq z \leq 1$), and further comprises mixed crystals that include phosphorous (P) and/or arsenic (As) in addition to nitrogen (N), as group-V elements.

The composition range is good if the subscripts x, y, z in the formula are within the range mentioned above. For example, GaN doped with an extremely small amount of indium is a "nitride semiconductor" according to the specification and in the claims.

As for the light emitting device of nitride semiconductor, there are many cases to use the cladding layer of $Al_y Ga_{1-y} N$ ($0 < y < 0.5$) for the active layer in order to suppress overflow of a carrier from the active layer made of InGaN or GaN. Aluminum (Al) composition of around 10% is necessary at least in order to suppress the overflow of a carrier effectively. However, when Al composition is increased, it becomes difficult to get ohmic contact with a p-side electrode, thus a problem that operating voltage is increased occurs.

A method to form the p-type contact layer made of p-type InGaN or p-type GaN doped with Mg on the AlGaN cladding layer is mentioned in Patent Laid-Open No. H6-268259 issue bulletin and Patent Laid-Open No. H9-289351 issue in order to reduce operating voltage.

FIG. 8 is the outline sectional view which exemplifies the LED which possess such contact layer.

In the LED shown in the figure, buffer layer 112, n-type GaN layer 113, active layer 114, p-type AlGaN cladding layer 115, p-type GaN contact layer 116 are formed in this sequence on the sapphire substrate 111.

On n-type GaN layer 113, n-side electrode 163 and bonding pad 164 are formed, and on p-type GaN contact layer 116, p-side electrode 165 and bonding pad 166 are formed. In addition, the surface of the device is coated with protective films 161, 162, According to the structure shown in the figure, by forming the electrode 165 in contact with the p-type GaN contact layer, an ohmic contact is made and the operating voltage can be lowered to some extent.

On the other hand, a trial to reduce the contact resistance with the electrode by increasing the concentration of the magnesium (Mg) in the surface region of the p-type contact layer is described in the Japanese Patent No. 2666237.

However, by these both methods, the operating voltage of the light emitting device is about 3.5V, which is still high.

Another method to lower the operating voltage of an device is decribed in a Patent Laid-Open No. H9-289351, which uses a p-type InGaN contact layer doped with magnesium (Mg). That is, a potential barrier of valence band can be lowered by using InGaN instead of GaN, thus the operating voltage can be reduced. However, actually, as for InGaN, there is a problem to be hard to make the p-type conductivity compared to GaN. Therefore the light emitting device which used this method has not been put to practical use at all.

SUMMARY OF THE INVENTION

The present invention has beeen made substrated on recognition of above-mentioned problems. In other words the object of the invention is to reduce the operating voltage, and to offer the nitride semiconductor light emitting device which can work stably by the commonly-used voltage power source.

According to the invention, there is provided a semiconductor light emitting device comprising: a contact layer formed of a nitride semiconductor; and a p-side electrode provided in contact with a surface of the contact layer, the contact layer having an alternatively stacked structure of first nitride semiconductor layers having a wider bandgap and second nitride semiconductor layers having a narrower bandgap, the first semiconductor layers being selectively doped with a p-type dopant.

According to the invention there is provided another semiconductor light emitting device comprising: a contact layer formed of a nitride semiconductcr; and a p-side electrode provided in contact with a surface of the contact layer, the contact layer having an alternatively stacked structure of first nitride semiconductor layers having a higher hardness and second nitride semiconductor layers having a lower hardness, the first semiconductor layers being selectively doped with a p-type dopant.

According to the invention there is provided yet another semiconductor light emitting device comprising: a contact layer formed of a nitride semiconductor; and a p-side electrode provided in contact with a surface of the contact layer, the contact layer having an alternatively stacked structure of first nitride semiconductor layers and second nitride semiconductor layers, the second nitride semiconductor layers including a higher content of indium than the first nitride semiconductor layers.

Generally, doping in the superlattice structure is made preferentially into the layers having a narrower bandgap. However, in a case of a nitride semiconductor, the hardness becomes higher as Al (aluminum) composition rises and bandgap thereof becomes wider, while the hardness becomes lower as In (indium) composition rises and bandgap thereof becomes narrower. Therefore, in this specific material system, it is effective to selectively dope the layers having a wider bandgap and a higher hardness.

The layers having a lower hardness have a function as buffer layers and improve the crystal quality by accommodating the crystal strain. According to the invention, non-doping to these soft layers prevents the degradation of crystal and keeps the function as buffer layers.

According to the invention, the operating voltage of semiconductor light emitting device consisting of a nitride semiconductor can be decreased effectively and the luminescence property can be improved.

In other words, the generation of heat in a contact part is restrained by decreasing the contact resistance at the p-side electrode, and thus the temperature characteristic of the device is improved, and life can also be improved.

In particular, in case of laser diodes, the generation of heat in a contact part with an electrode becomes more serious since a larger amount of current should be injected. According to the invention, the contact resistance at p-side can be advantageously decreased. Accordingly, the operating voltage is decreased and the heat generation is suppressed. As a result, the temperature characteristics is improved and the reliability such as device life is drastically improved.

In addition, it becomes possible to easily operate the semiconductor light emitting device by using a power supply of general-purpose batteries because the operating voltage of the device is decreased. For example, according to the present invention, operating voltage of light emitting device can be decreased to less than 3V. As a result, the light emitting device according to the invention can be used in various kinds of battery-operated machines such as laser pointers, portable computers, personal data assistants and video players.

In other words portable machines having full color display and multicolored display of every kind become possible to be realized, and a merit on industry is great.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DETAILED DESCRIPTION OF THE PREFERRED EMBODIMENTS

Figure 1:
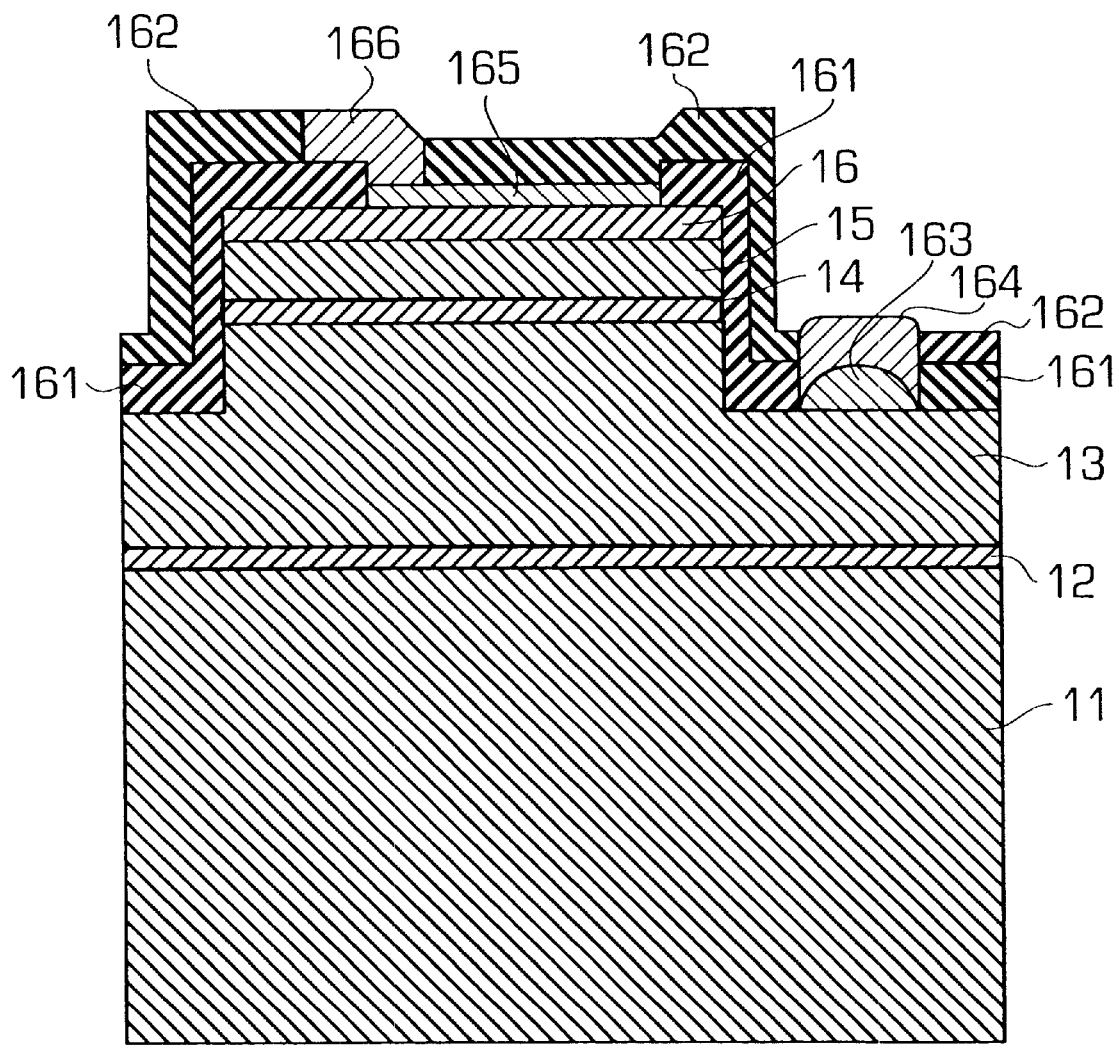
FIG. 1 is a schematic sectional view showing nitride semiconductor light emitting device in accordance with a first embodiment of this invention.

Embodiments of the invention are explained as follows referring to the drawings.

First Embodiment

FIG. 1 is a schematic sectional view showing nitride semiconductor light emitting device in accordance with a first embodiment of this invention. The figure exemplifies cross section structure of LED where GaN buffer layer 12, n-type GaN (Si-doped) layer 13, five-period MQW (multiple-quantum well) InGaN active layer 14, p-type $Al_{0.20}Ga_{0.90}N$ (Mg-doped) layer 15, superlattice contact layer 16 are stacked in this sequence on sapphire substrate 11.

The superlattice contact layer 16 is a semiconductor layer coming in contact with p-side electrode 165, and the superlattice structure is made by laminating nitride semiconductor layers of a wider bandgap and a narrower bandgap. In the superlattice structure, p-type dopant is doped selectively in the nitride semiconductor layers of a wider bandgap. In other wards, the nitride semiconductors of the wider bandgap may correspond to the ones having a hiher hardness and the nitride semiconductors of the narrower bandgap may correspond to the ones having a lower hardness. For example, the superlattice contact layer 36 can be a $In_{0.01}Ga_{0.99}N/GaN$ (Mg-doped) modulation-doped supperlattice structure.

The outline of the fabrication process of the LED of FIG. 1 will be explained below.

At first, sapphire substrate 11 is heated up to 1100 degrees centigrade for ten minutes while flowing hydrogen gas in order to remove an surface oxide layer therefrom. Next, the substrate is cooled down to 550 degrees centigrade, then TMG (trimethyl gallium), ammonia and carrier gas are supplied and GaN buffer layer 12 of thickness of 100 nm is grown.

Then, temperature of the substrate is heated up to 1100 degrees centigrade, and n-type GaN (Si-doped) layer 13 of 4 $\mu m$ in thickness is grown by supplying TMG, $SiH_4$, ammonia and carrier gas.

The temperature of the substrate is then cooled down to 750 degrees centigrade and the five-period MQW active layer 14 is grown by supplying TMG, TMI (trimethyl indium), ammonia and carrier gas. Active layer 14 may have the structure comprising five layers of GaN barrier layer of 6 nm in thickness and five layers of InGaN well layers of 3 nm in thickness stacked alternately. The active layer 14 may be doped with appropriate dopant.

Then the substrate is heated up to 950 degrees centigrade and p-type $Al_{0.10}Ga_{0.90}N$ (Mg-doped) cladding layer 15 of 200 nm in thickness is grown by supplying TMG, TMA (trimethyl aluminum), $Cp_2Mg$, ammonia and carrier gas. The concentration of Mg in the cladding layer 15 may be, for example, about $5.0 \times 10^{19}$ $cm^{-3}$.

Then while keeping the temperature of the substrate at 950 degrees centigrade, the superlattice contact layer 16 is grown. More specifically, the InGaN well layers of 3 nm in thickness are grown by supplying TMG, TMI, ammonia and carrier gas, and p-type GaN (Mg-doped) barrier layers of 6 nm in thickness is grown by supplying TMG, ammonia, $Cp_2Mg$ and carrier gas. Superlattice contact layer 16 can be formed by stacking these layers alternately by 50 periods, for example. The concentration of Mg in GaN barrier layer may be, for example, about $1.0 \times 10^{20}$ $cm^{-3}$.

The wafer is then cooled down to room temperature, and is taken out from the reactor. A part of the stacked layers on the substrate is then etched away to expose the n-type contact layer 13 as shown in FIG. 1, and n-side electrode 163 is formed. Further, the p-side electrode 165 having a transparency to the light emitted from the active layer 14 is formed on the p-type contact layer 16. Furthermore, after coating the surface of the device with protective film 161 and connect bonding pads 164 and 166 to the electrodes, the surface of the device is covered with protective film 162 to complete the light emitting diode of FIG. 1.

As the transparent p-side electrode 165, a stacked layers of Ni (nickel)/Au (gold)/Ni or oxide/metal layered structure such as ITO (indium tin oxide)/Ni can be used, for example.

The LED which has been fabricated in the above-mentioned way, showed a forward voltage Vf=3.2V, blue luminescence of emission peak wavelength 450 nm and the radiant power output of 3.3 mW in a condition of forward driving current If=20 mA.

The inventors have also fabricated a comparative sample which had essentially the same structure as shown in FIG. 1 except that the contact layer 16 is made of a p-type GaN (Mg-doped) layer with a Mg concentration of $1.0 \times 10^{20}$ cm$^{-3}$ and a thickness of 0.30 μm. This comparative sample has showed Vf=3.7V, blue luminescence of emission peak wavelength 450 nm and the radiant power output of 3.1 mw with If=20 mA.

Thus, the light emitting device of the invention has a lower operating voltage than the comparative example, while the radiant power output is improved.

As the reasons why the operating voltage is reduced by using the superlattice contact layer 16 according to the invention, the following three reasons can be raised.

As the first reason, reduction of potential barrier of valence band between the p-type contact layer and the p-side electrode is regarded. The contact layer and a method to do are mentioned in Patent Laid-Open No. H9-289351 using a single layer consisting of InGaN as mentioned above. However, the enough improvement was not actually provided by the conventional art, since InGaN layer can not be made p-type easily compared with GaN layer.

In contrast to this, according to the invention, by stacking the highly-doped GaN layers and the non-doped InGaN layers alternately, it is thought that both merit of InGaN and merit of GaN can be obtained. In other wards, while easily realizing a highly-doped p-type layers with GaN, the barrier of valence band can be effectively lowered by InGaN layers.

As the second reason, crystalline improvement can be regarded. That is, InGaN acts as a buffer layer in the supperlattice structure with GaN layer, since InGaN is softer compared with GaN. Thus, the crystal defects such as penetrating dislocations and cracks are reduced, and the crystalline quality is improved. However, crystal of InGaN is easy to deteriorate, especially when it s doped with high concentration of impurities. Accordingly, when InGaN layer is doped with Mg, its function as a buffer layer may be lost. In addition, crystal quality of InGaN becomes bad when it is highly doped with p-type dopant as described in Patent Laid-Open No. H9-289351 and thus it is difficult to lower the operating voltage.

In contrast to this, according to the invention, Mg is doped selectively into the GaN barrier layers. As a result, the InGaN well layers can advantageously function as a buffer layers in the supperlattice structure.

As the third reason, an increase in effective carrier density and carrier mobility is regarded. Its mentioned above, it is difficult to make InGaN layer p-type fully even if doping is done with p-type dopant in InGaN. In contrast to this, according to the invention, the p-type dopant is fully activated and the effective carrier denesity can be fully increased by the modulation-doping to GaN barrier layers. Furthermore, impurity scattering can be effectively suppressed by modulation-doping, and electron holes having a high mobility can be obtained.

It is preferable to keep indium composition of the InGaN well layer less than 20% and more preferably less than 10% in order to avoid the degradation of the crystal quality of the superlattice contact layer. Theoretically, only a small amount of indium in the InGaN well layer may realize the above-mentioned advantageous effects of the present invention.

The inventors have confirmed that any substantial difference was not found in device characteristics between the cases where the layer which was grown last was InGaN well layer and GaN (Mg-doped) barrier layer. In other words, as the layer of superlattice contact layer 16 to be in contact with the p-side electrode 165, either InGaN layer and GaN layer may work well. This is because the average potential of well layers and barrier layers is effective as a whole in the case of supperlattice structure.

As for the doping concentration of Mg into GaN barrier layer, $1 \times 10^{19} - 1 \times 10^{21}$ cm$^{-3}$ is preferable. This is because the crystal quality deteriorates if the doping concentration is too high, and because enough p-type conductivity is not obtained if the doping concentration is too low.

Second Embodiment

Figure 2:
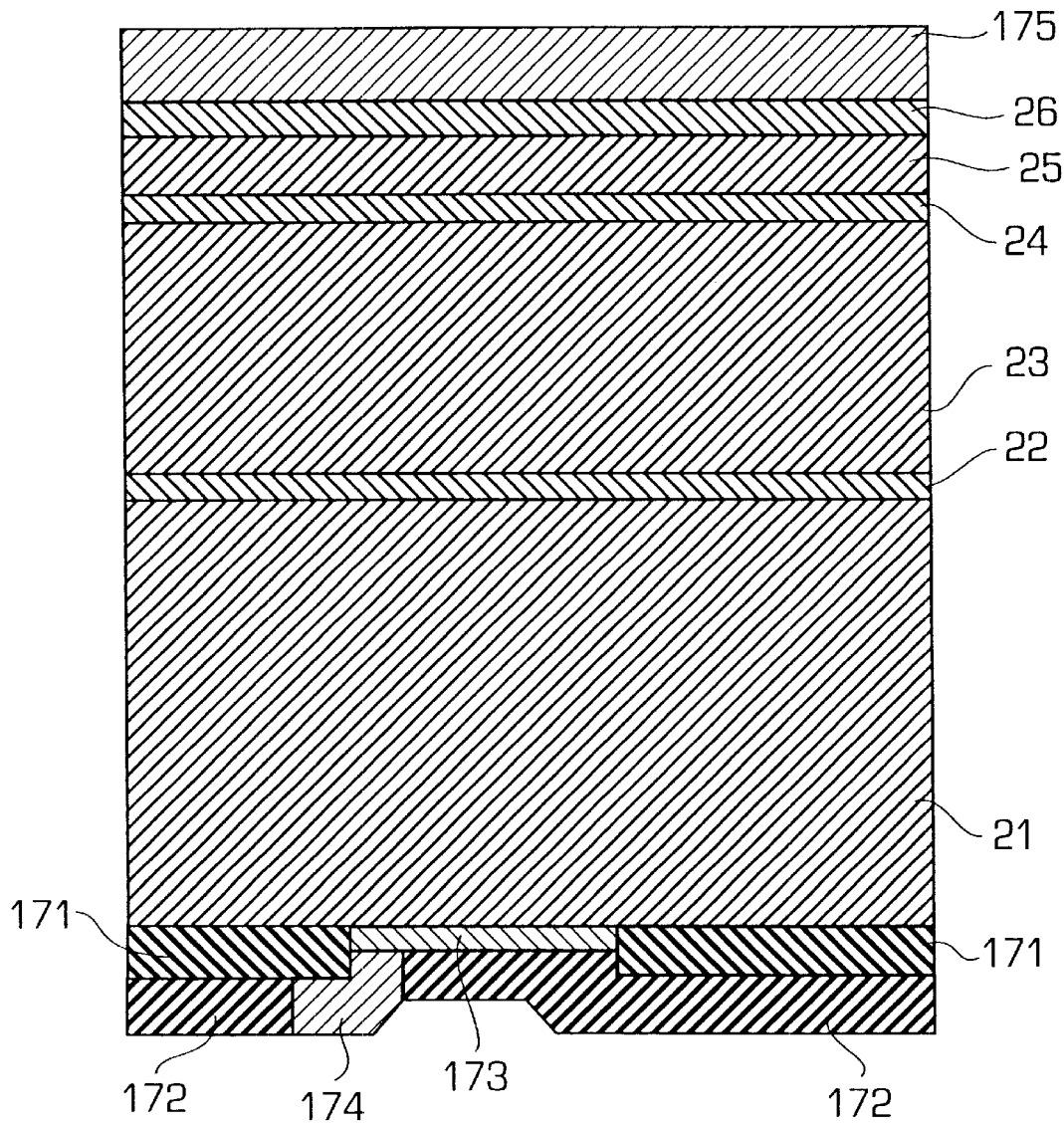
FIG. 2 is a schematic sectional view showing nitride semiconductor light emitting device in accordance with a second embodiment of this invention.

FIG. 2 is a schematic sectional view showing nitride semiconductor light emitting device according to the second embodiment of the invention. The figure exemplifies cross section structure of LED in which GaN buffer layer 22, n-type GaN (Si-doped) layer 23, five-period MQW InGaN active layer 24, p-type $Al_{0.10}Ga_{0.90}N$ (Mg-doped) layer 25, $In_{0.01}Ga_{0.99}N$/GaN (Mg-doped) modulation-doped superlattice contact layer 26 are stacked in this sequence on a GaN substrate 21.

The outline of the fabrication process of the LED of FIG. 2 is similar to that of FIG. 1 as explained below.

At first, GaN substrate 21 is heated up to 1100 degrees centigrade in a reactor for ten minutes while flowing hydrogen gas in order to remove an surface oxide layer therefrom. Next, the substrate is cooled down to 550 degrees centigrade, then TMG, ammonia and carrier gas are supplied and GaN buffer layer 22 of thickness of 100 nm is grown.

Then, temperature of the substrate is heated up to 1100 degrees centigrade, and n-type GaN (Si-doped) layer 23 of 4 μm in thickness is grown by supplying TMG, SiH$_4$, ammonia and carrier gas.

The temperature of the substrate is then cooled down to 750 degrees centigrade and the five-period MQW active layer 24 is grown by supplying TMG, TMI, ammonia and carrier gas. Active layer 24 may have the structure comprising five layers of GaN barrier layer of 6 nm in thickness and five layers of InGaN well layers of 3 nm in thickness stacked alternately. The active layer 24 may be doped with appropriate dopant.

Then the substrate is heated up to 950 degrees centigrade and p-type $Al_{0.10}Ga_{0.90}N$ (Mg-doped) cladding layer 25 of 200 nm in thickness is grown by supplying TMG, TMA (tri-methyl aluminum), Cp$_2$Mg, ammonia and carrier gas. The concentration of Mg in the cladding layer 15 may be, for example, about $5.0 \times 10^{19}$ cm$^{-3}$.

Then while keeping the temperature of the substrate at 950 degrees centigrade, the superlattice contact layer 26 is grown. More specifically, the lnGaN well layers of 3 nm in thickness are grown by supplying TMG, TMI, ammonia and carrier gas, and p-type GaN (Mg-doped) barrier layers of 6 nm in thickness is grown by supplying TMG, ammonia, Cp$_2$Mg and carrier gas. Superlattice contact layer 265 can be formed by stacking these layers alternately by 50 periods, for example. The concentration of Mg in GaN barrier layer may be, for example, about $1.0 \times 10^{20}$ cm$^{-3}$.

The wafer is then cooled down to room temperature, and is taken out from the reactor. In case of the device shown in FIG. 2, a p-side electrode 175 is formed on the whole surface of the p-type contact layer 26. On the back surface of the GaN substrate 21, a transparent n-side electrode 173 is formed and a bonding pad 174 is partly overlying thereon. Then passivation films 171 and 172 are formed on the rear surface of the device.

While the sapphire substrate is electrically insulative, the GaN substrate 21 of the embodiment is conductive. Therefore, it becomes possible to form one electrode on the rear surface of the substrate. This construction makes the device size more compact while keeping the effective light emitting area.

The LED according to the embodiment showed a forward voltage Vf=2.9V, blue luminescence of emission peak wavelength 450 nm and the radiant power output of 3.5 mW in a condition of forward driving current If=20 mA.

The inventors have also fabricated a comparative sample which had essentially the same structure as shown in FIG. 2 except that the contact layer 26 is made of a p-type GaN (Mg-doped) layer with a Mg concentration of $1.0 \times 10^{20}$ cm$^{-3}$ and a thickness of 0.30 µm. This comparative sample has showed Vf=3.7 V, blue luminescence of emission peak wavelength 450 nm and the radiant power output of 3.3 mW with If=20 mA.

Thus, the light emitting device of the embodiment has a drastically decreased operating voltage of 2.9 V. This decreased operating voltage less than 3 V is especially advantageous in the practical applications, because commonly used supply voltage level in various portable equipments is 3 V. As a result, the light emitting device can be used in many battery-operated equipments.

As the reason why such a drastic decrease in operating voltage was obtained, the following two reasons may be raised.

The first reason is that the p-side electrode 175 is formed on the whole surface of the contact layer 26. In the case of nitride semiconductor device, it is difficult to decrease the contact resistance of p-side in particular compared to n-side. According to the embodiment, the p-side electrode 175 can be formed in full contact with p-type contact layer 26 on the entire surface. Besides, because it is the structure that light is not taken out from p-side, the thickness of the p-side electrode 175 can be full enough so that the contact resistance is decreased remarkably. As mentioned above, it is not easy in the ease of sapphire substrate to realize such a device structure.

As the second reason, improvements in mobility and activity of p-type carrier caused by the crystalline improvement can be regarded. That is, in the case where the GaN substrate is employed the crystal defects such as penetrating dislocations are reduced compared to the case where the sapphire substrate is employed. As a result, the crystal quality is improved. This leads to the improvements in mobility and the activation ratio of carriers, and the device resistance is decreased.

Third Embodiment

Figure 3:
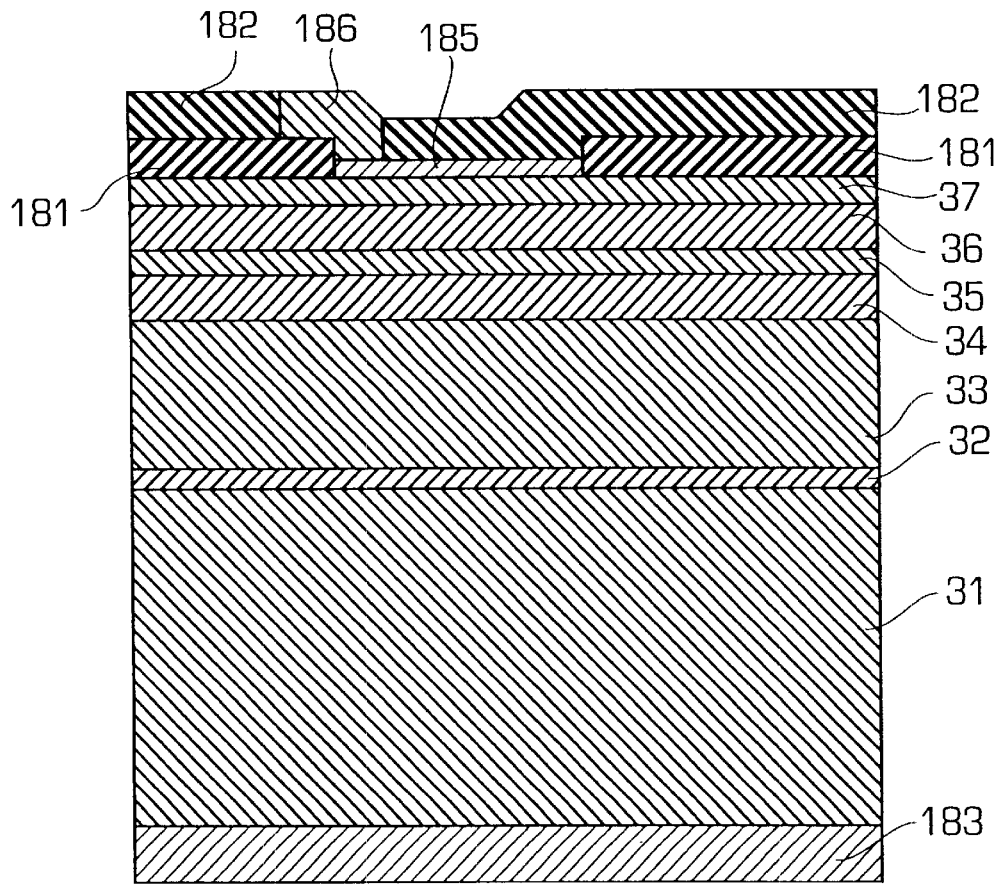
FIG. 3 is a schematic sectional view showing nitride semiconductor light emitting device in accordance with a third embodiment of this invention.

FIG. 3 is a schematic sectional view showing nitride semiconductor light emitting device according to the third embodiment of the invention. The figure exemplifiers cross section structure of LED in which AlN buffer layer 32, n-type GaN (Si-doped) layer 33, n-type $Al_{0.10}Ga_{0.90}N$ (Si-doped) layer 34, GaN (Si- and Zn-doped) active layer 35, p-type $Al_{0.10}Ga_{0.90}N$ (Mg-doped) layer 36, $In_{0.02}Ga_{0.98}N$/GaN (Mg-doped) modulation-doped superlattice contact layer 37 are stacked in this sequence on a SiC substrate 31.

The outline of the fabrication prociss of the LED of FIG. 3 is similar to that of FIG. 1 as explained below.

At first, SiC substrate 31 is heated tip to 1100 degrees centigrade in a reactor for ten minutes while flowing hydrogen gas in order to remove an surface oxide layer therefrom. Next, the substrate is cooled down to 600 degrees centigrade, then TMA, ammonia and carrier gas are supplied and AlN buffer layer 32 of thickness of 30 nm is grown.

Then, temperature of the substrate is heated up to 1100 degrees centigrade, and n-type GaN (Si-doped) layer 33 of 4 µm in thickness is grown by supplying TMG, SiH$_4$, ammonia and carrier gas.

While keeping the substrate temperature at 1100 degrees centigrade, n-type $Al_{0.10}Ga_{0.90}N$ (Si-doped) layer 34 of 30 nm in thickness is grown by supplying TMG, TMA, SiH$_4$, ammonia and carrier gas.

Again, while keeping the temperature of the substrate at 1100 degrees centigrade the GaN (Si- and Zn-doped) active layer 35 of 40 nm in thickness is grown by supplying TMG, ammonia, Zn(CH$_3$)$_2$, SiH$_4$ and carrier gas.

Then the temperature of the substrate is kept at 1100 degrees centigrade and p-type $Al_{0.10}Ga_{0.90}N$ (Mg-doped) cladding layer 36 of 60 nm in thickness is grown by supplying TMG, TMA (trimethyl aluminum), Cp$_2$Mg, ammonia and carrier gas. The concentration of Mg in the cladding layer 15 may be, for example, about $5.0 \times 10^{19}$ cm$^{-3}$.

Then the temperature of the substrate is decreased down to 900 degrees centigrade and the superlattice contact layer 37 is grown. More specifically, the $In_{0.02}Ga_{0.98}N$ well layers of 3 nm in thickness are grown by supplying TMG, TMI, ammonia and carrier gas, and p-type GaN (Mg-doped) barrier layers of 3 nm in thickness is grown by supplying TMG, ammonia, Cp$_2$Mg and carrier gas. Superlattice contact layer 37 can be formed by stacking these layers alternately by 50 periods, for example. The concentration of Mg in GaN barrier layer may be, for example, about $2.0 \times 10^{20}$ cm$^{-3}$.

The wafer is then cooled down to room temperature, and is taken out from the reactor. In case of the device shown in FIG. 3, an n-side electrode 183 is forced on the whole rear surface of the substrate 31. A transparent p-side electrode 185 is formed on the p-type contact layer 37. Further, a bonding pad 186 is connected to the p-side electrode 186. The surface of the device is covered with passivation films 181 and 182. As the p-side electrode, a metal/matel system such as Ni/Au/Ni or an oxide/metal system such as ITO/Ni can be used.

The LED according to the embodiment showed a forward voltage Vf=3.3V, blue-violet luminescence of emission peak wavelength 430 nm and the radiant power output of 1.5 mW in a condition of forward driving current If=20 mA.

The inventors have also fabricated a comparative sample which had essentially the same structure as shown in FIG. 3 except that the contact layer 37 is made of a p-type GaN (Mg-doped) layer with a Mg concentration of $2.0 \times 10^{20}$ cm$^{-3}$ and a thickness of 0.30 µm. This comparative sample has showed Vf=4.0 V, luminescence of emission peak wavelength 430 nm and the radiant power output of 1.3 mW with If=20 mA.

In the case of device in which indium is not given to the active layer and the aluminum composition of the cladding layer is increased as exemplified in FIG. 3, operating voltage is easy to become higher as can be understood from the evaluation result of comparative sample. However, according to the invention, operating voltage can be lowered remarkably by using the InGaN/GaN (Mg-doped) modulation-doped superlattice contact layer 37.

On the other hand, in the case where SiC substrate is used, penetrating dislocations are sometimes observed, which may cause a device-to-device fluctuation of an operating voltage of the LEDs. By using the superlattice contact layer, the device-to-device fluctuation of the operating voltage is reduced and fairly reproducible characteristics can be assured. That is, the InGaN layers of the superlattice contact layer are soft enough to accommodate the strain caused by the penetrating dislocations. As a result, the crystallinity of the contact layer is improved and contact resistance is decreased, then the device-to-device fluctuation of the operating voltage becomes much smaller.

Fourth Embodiment

Figure 4:
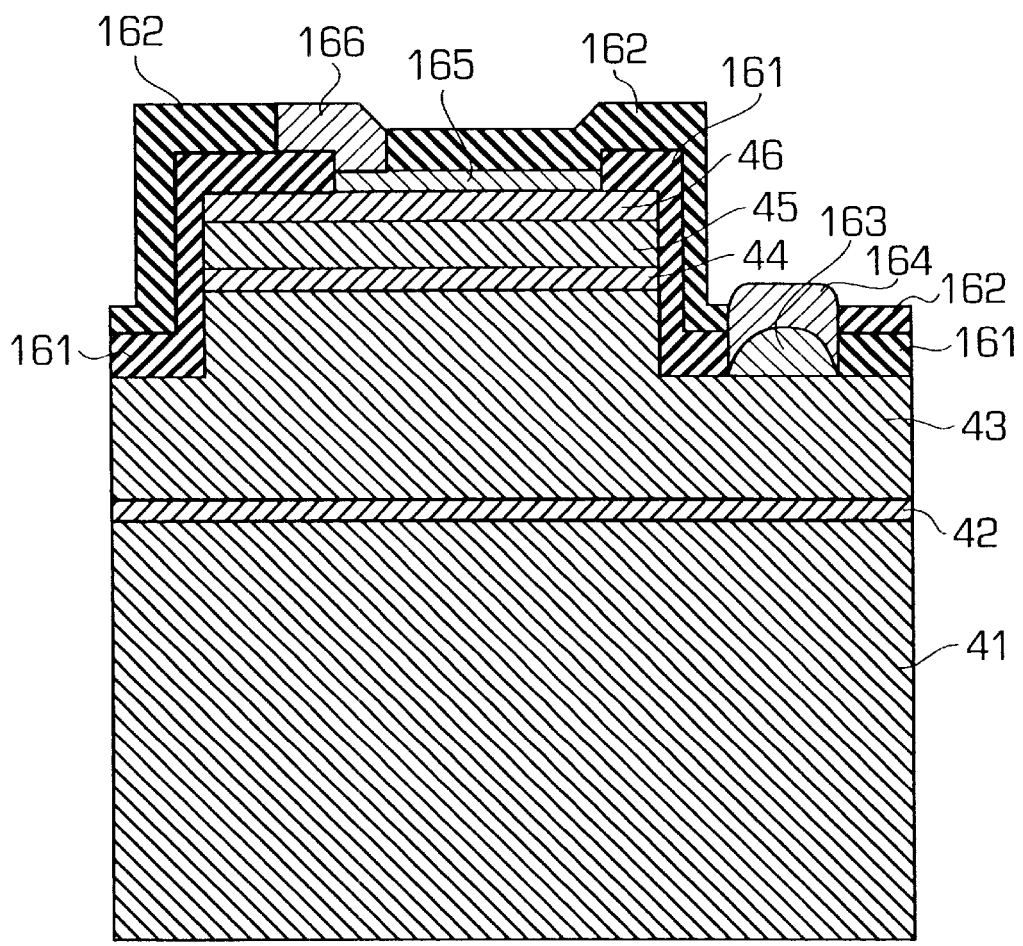
FIG. 4 is a schematic sectional view showing nitride semiconductor light emitting device in accordance with a fourth embodiment of this invention.

FIG. 4 is a schematic sectional view showing nitride semiconductor light emitting device in accordance with a fourth embodiment of this invention. The figure exemplifies cross section structure of LED where GaN buffer layer 42, n-type GaN (Si-doped) layer 43, five-period MQW (multiple-quantum well) InGaN active layer 44, p-type $Al_{0.10}Ga_{0.90}N$ (Mg-doped) layer 45, $In_{0.01}Ga_{0.9}N$/GaN (Zn-doped) superlattice contact layer 46 are stacked in this sequence on sapphire substrate 41.

The detail of the structure and the fabrication process of the device of the embodiment may be essentially the same as the one with regard to the first embodiment of the invention, therefore the detailed explanation is omitted.

According to the embodiment, zinc is doped into the GaN layers of the superlattice contact layer 46 instead of magnesium. Zinc can be doped by supplying, for example, $Zn(CH_3)_2$ as a dopant gas during the growth of GaN layers of the contact layer 46. The concentration of zinc in the GaN layers can be set at about $1.0 \times 10^{20}$ $cm^{-3}$.

The LED according to the embodiment showed a forward wavelength 450 nm and the radiant power output of 3.0 mW in a condition of forward driving current If=20 mA.

The inventors have also fabricated a comparative sample which had essentially the same structure as shown in FIG. 4 except that the contact layer 46 is made of a p-type GaN (Zn-doped) layer with a Zn concentration of $1.0 \times 10^{20}$ $cm^{-3}$ and a thickness of 0.30 μm. This comparative sample has showed Vf=4.0 V, luminescence of emission peak wavelength 450 nm and the radiant power output of 2.8 mW with If=20 mA.

As can be seen from these results, the operating voltage can be effectively decreased by introducing the modulation-doped superlattice contact layer doped with zinc.

Fifth Embodiment

Figure 5:
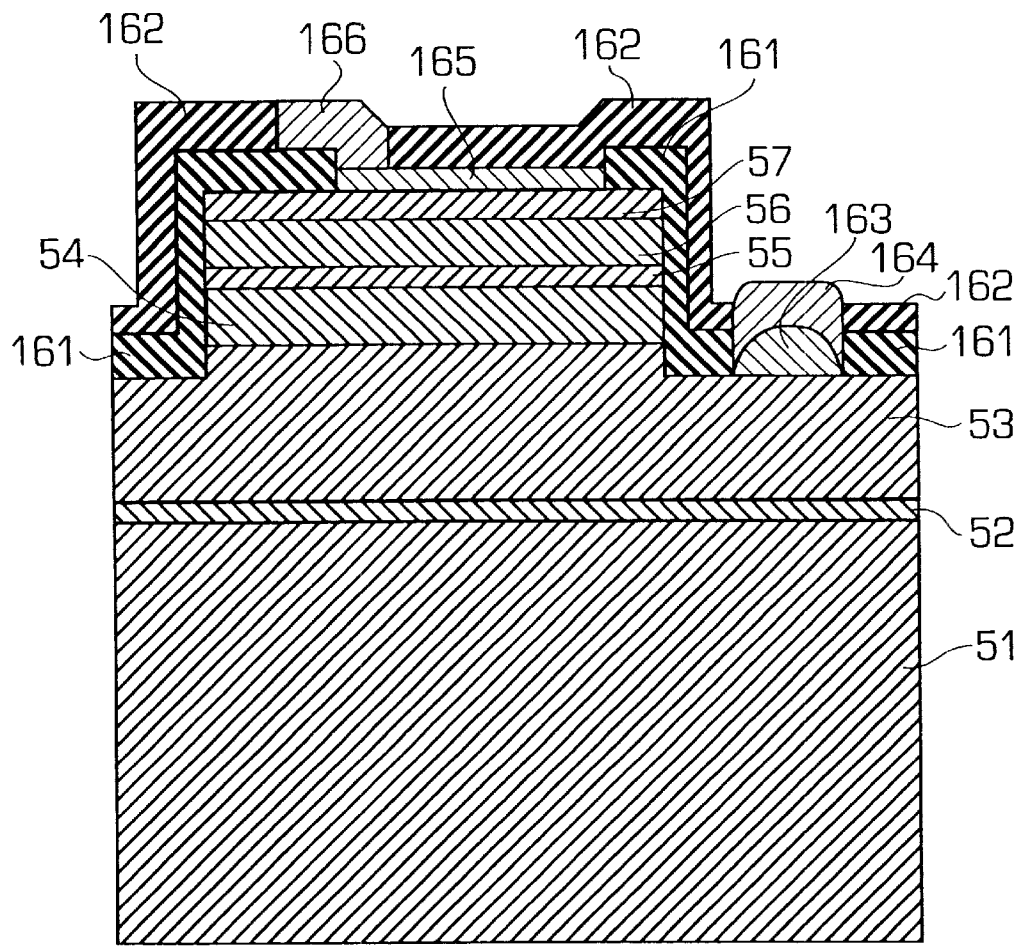
FIG. 5 is a schematic sectional view showing nitride semiconductor light emitting device in accordance with a fifth embodiment of this invention.

FIG. 5 is a schematic sectional view showing nitride semiconductor light emitting device in accordance with a fifth embodiment of this invention. The figure exemplifies cross section structure of LED where GaN buffer layer 52, n-type GaN (Si-doped) layer 53, n-type $Al_{0.10}Ga_{0.90}N$ (Si-doped) layer 54, GaN (Si- and Zn-doped) active layer 55, p-type $Al_{0.10}Ga_{0.90}N$ (Mg-doped) layer 56, $In_{0.01}Ga_{0.09}N$/GaN (C-doped) superlattice contact layer 57 are stacked in this sequence on sapphire substrate 51.

The detail of the structure and the fabrication process of the device of the embodiment may be essentially the same as the one with regard to the first and third embodiments of the invention, therefore the detailed explanation is omitted.

According to the embodiment, carbon (C) is doped into the GaN layers of the superlattice contact layer 57. The growth temperature of these layers can be set at about 900 degrees centigrade. $CBr_4$ or other appropriate source can be used as a doping gas source for carbon doping. A phenomenon called "auto-doping" can be utilized by adjusting the flow ratio of the group III source gas and the group IV source gas. The concentration of carbon in the GaN layers can be set at about $2.0 \times 10^{20}$ $cm^{-3}$.

The LED according to the embodiment showed a forward voltage Vf=3.4V, blue luminescence of emission peak wavelength 430 nm and the radiant power output of 1.4 mW in a condition of forward driving current If=20 mA.

The inventors have also fabricated a comparative sample which had essentially the same structure as shown in FIG. 5 except that the contact layer 57 is made of a p-type GaN (C-doped) layer with a C concentration of $2.0 \times 10^{20}$ $cm^{-3}$ and a thickness of 0.30 μm. This comparative sample has showed Vf=4.0 V, luminescence of emission peak wavelength 430 nm and the radiant power output of 1.4 mW with If=20 mA.

As can be seen from these results, the operating voltage can be effectively decreased by introducing the modulation-doped superlattice contact layer doped with carbon.

Sixth Embodiment

Figure 6:
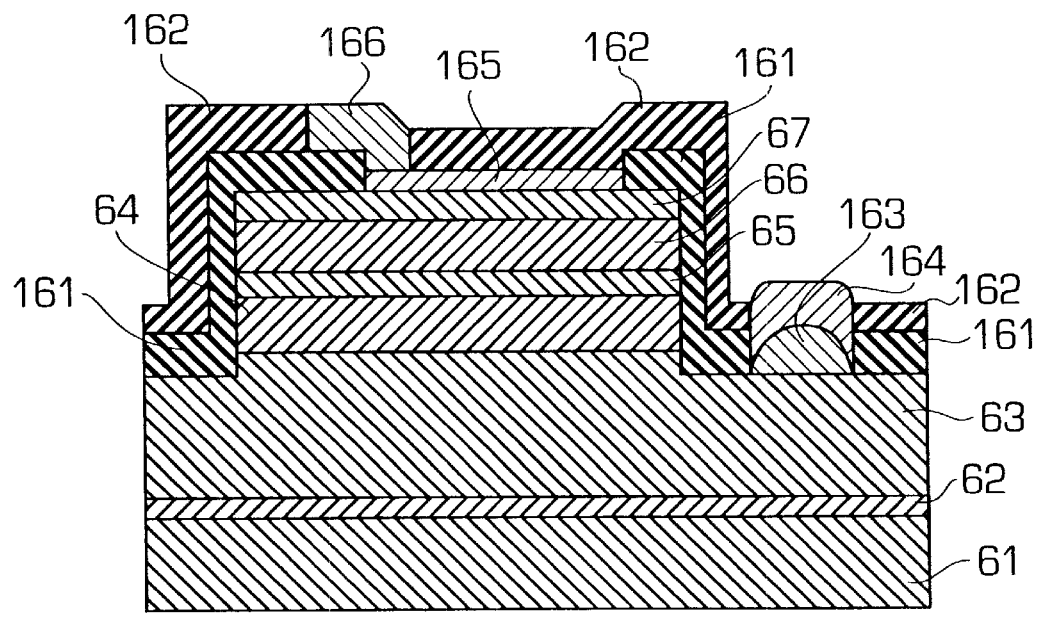
FIG. 6 is a schematic sectional view showing nitride semiconductor light emitting device in accordance with a sixth embodiment of this invention.

FIG. 6 is a schematic sectional view showing nitride semiconductor light emitting device according to the sixth embodiment of the invention. The figure exemplifies cross section structure of LED in which GaN buffer layer 62, n-type GaN (Si-doped) layer 63, n-type $Al_{0.10}Ga_{0.90}N$ (Si-doped) layer 64, five-period MQW InGaN active layer 65, p-type $Al_{0.10}Ga_{0.90}N$ (Mg-doped) layer 66, GaN/$Al_{0.01}Ga_{0.99}N$ (Mg-doped) modulation-doped superlattice contact layer 67 are stacked in this sequence on a sapphire substrate 61.

The outline of the fabrication process of the LED of FIG. 6 is similar to that of FIG. 1 as explained below.

At first, sapphire substrate 61 is heated up to 1100 degrees centigrade in a reactor for ten minutes while flowing hydrogen gas in order to remove an surface oxide layer therefrom. Next, the substrate is cooled down to 550 degrees centigrade then TMG, ammonia and carrier gas are supplied and GaN buffer layer 62 of thickness of 100 nm is grown.

Then, temperature of the substrate is heated up to 1100 degrees centigrade, and n-type GaN (Si-doped) layer 63 of 4 μm in thickness is grown by supplying TMG, $SiH_4$, ammonia and carrier gas.

After decreasing the temperature of the substrate, n-type $Al_{0.10}Ga_{0.90}N$ (Si-doped) layer 64 is grown by supplying TMG, TMA, $SiH_4$, ammonia and carrier gas.

Then, after decreasing the temperature of the substrate down to 700 degrees centigrade, five-period MQW InGaN active layer 65 is grown by supplying TMG, TMI ammonia and carrier gas. Active layer 65 may have the structure comprising five layers of GaN barrier layer of 6 nm in thickness and five layers of InGaN well layers of 3 nm in thickness stacked alternately. The active layer 65 may be doped with appropriate dopant.

After heating the substrate up to 1000 degrees centigrade p-type $Al_{0.10}Ga_{0.90}N$ (Mg-doped) cladding layer 66 of 200 nm in thickness is grown by supplying TMG, TMA, $Cp_2Mg$, ammonia and carrier gas. The concentration of Mg in the cladding layer 65 may be, for example, about $5.0 \times 10^{19}$ $cm^{-3}$.

Then, while keeping the temperature of the substrate at 1000 degrees centigrade, the superlattice contact layer 67 is grown. More specifically, the GaN well layers of 2 nm in thickness are grown by supplying TMG, ammonia and carrier gas, and p-type $Al_{0.01}Ga_{0.99}N$ (Mg-doped) barrier layers of 2 nm in thickness is grown by supplying TMG, TMA, ammonia, $Cp_2Mg$ and carrier gas. Superlattice contact layer 67 can be formed by stacking these layers alternately by 50 periods, for example. The concentration of Mg in AlGaN barrier layer may be, for example, about $1.0 \times 10^{20}$ $cm^{-3}$.

The wafer is then cooled down to room temperature, and is taken out from the reactor. A part of the stacked layers on the substrate is then etched away to expose the n-type contact layer 63 as shown in FIG. 6, and n-side electrode 163 is formed. Further, the p-side electrode 165 having a transparency to the light emitted from the active layer 65 is formed on the p-type contact layer 67. Furthermore, after coating the surface of the device with protective film 161 and connect bonding pads 164 and 166 to the electrodes, the surface of the device is covered with protective film 162 to complete the light emitting diode of FIG. 6.

As the transparent p-side electrode 165, a stacked layers of Ni/Au/Ni or oxide/metal layered structure such as ITO/Ni can be used, for example.

When Ni/Au/Ni stacked layers were used as the p-side electrode 165, the LED according to the embodiment has showed a forward voltage Vf=3.5V, blue luminescence of emission peak wavelength 450 nm and the radiant power output of 3.2 mW in a condition of forward driving current If=20 mA.

When ITO/Ni stacked layers were used as the p-side electrode 165, the LED according to the embodiment has showed a forward voltage Vf=3.3V, blue luminescence of emission peak wavelength 450 nm and the radiant power output of 3.2 mW in a condition of forward driving current If=20 mA. In addition to this, device-to-device fluctuation of the emission characteristics was not observed even when such a oxide electrode was used.

The inventors have also fabricated a comparative sample which had essentially the same structure as shown in FIG. 6 except that the contact layer 67 is made of a ptype GaN (Mg-doped) layer with a Mg concentration of $1.0 \times 10^{20}$ cm$^{-3}$ and a thickness of 0.05 µm. The emission characteristics did not essentially depend on the meterial of the p-side electrode and the comparative sample has showed Vf=3.7 V, luminescence of emission peak wavelength 450 nm and the radiant power output of 3.1 mW with If=20 mA.

In contrast to this, according to the embodiment, the operating voltage can be effectively reduced by employing a modulation-doped superlattice contact layer with doped-GaAlN layers and GaN layers. As thet reasons why the operating voltage is reduced by using the superlattice contact layer 67 according to the invention, the following two reasons can be raised.

As the first reason, crystalline improvement can be regarded like the case of InGaN/GaN superlattice contact layer. That is, GaN acts as a buffer layer in the supperlattice structure with GaAlN layer, since GaN is softer compared with GaAlN. Thus, the crystal defects such as penetrating dislocations and cracks are reduced, and the crystalline quality is improved. However, if the GaN layers are doped with high concentration of impurities, the crystalline quality of GaN layers is easy, to deteriorate. Accordingly, when GaN layers are doped with magnesium, their function as a buffer layer may be lost.

In contrast to this, according to the embodiment, magnesium is doped selectively into the GaAlN barrier layers. As a result, the GaN well layers can advantageously function as buffer layers in the supperlattice structure. According to the invention, by forming the contact layer with a modulation-doped superlattice structure where the harder layers are selectively doped, the crystal quality is effectively improved and good electrical contact is ensured.

According to the invention, InGaN/AlGaN, $In_xGa_{1-x}N$/$In_yGa_{1-y}N$ (x>y), $Al_xGa_{1-x}N$/$Al_yGa_{1-y}N$ (x>y), AlGaN/BAlGaN or any other appropriate combinations can be employed as the superlattice contact layer.

As the second reason, an increase in carrier mobility is regarded. The impurity scattering of the carriers in the contact layer can be suppressed by the modulation-doping of the superlattice. Accoridngly, the carrier mobility is improved and the contact resistance can be reduced.

In the present embodiment, the aluminum content of the AlGaN layers of the contact layer 67 may preferably be smaller than 20% and more preferably be smaller than 5%. When the aluminum content is too high, the operating voltage becomes higher and the crystal quality may be degraded. As for the lower limit of the aluminum content, very small amount of aluminum may work, however, more than 0.5% is preferable in order to ensure the function of AlGaN Layers as barrier layers.

In the present embodiment, it is noticeable that the low operating voltage can be realized by using the ITO/Ni electrode. This effect is believed to base on a fact that the nickel layer of the electrode is as thin as 100 nm, and a tunneling current can be easily generated between the superlattice contact layer and the ITO layer.

It should be noted that no essential difference in the device characteristics was found between the case where the top layer of the superlattice contact layer was GaN layer and the case where the top layer of the contact layer was AlGaN layer. That is, the layer which is in contacts with the p-side electrode 165 can be either GaN layer or AlGaN layer. This is supposed to be because the superlattice contact layer of the present invention shows an averaged characteristics as a whole of characteristis of GaN and AlGaN layers.

The inventors have also fabricated a sample in which, instead of AlGaN layers, the GaN layers in the superlattice contact layer 67 were selectively doped with magnesium. However, the operating voltage of this sample was not as low as the one where the AlGaN layers were selectively doped. As far as the activation yield of the dopant and the bandgap energy are concerned, it could be preferable to selectively dope into the GaN layers. However, the actual result shows that it is more preferable to dope AlGaN layers selectively. Thus, it is found that the improvement in the crystal quality is more effective in order to decrease the operating voltage.

Seventh Embodiment

Figure 7:
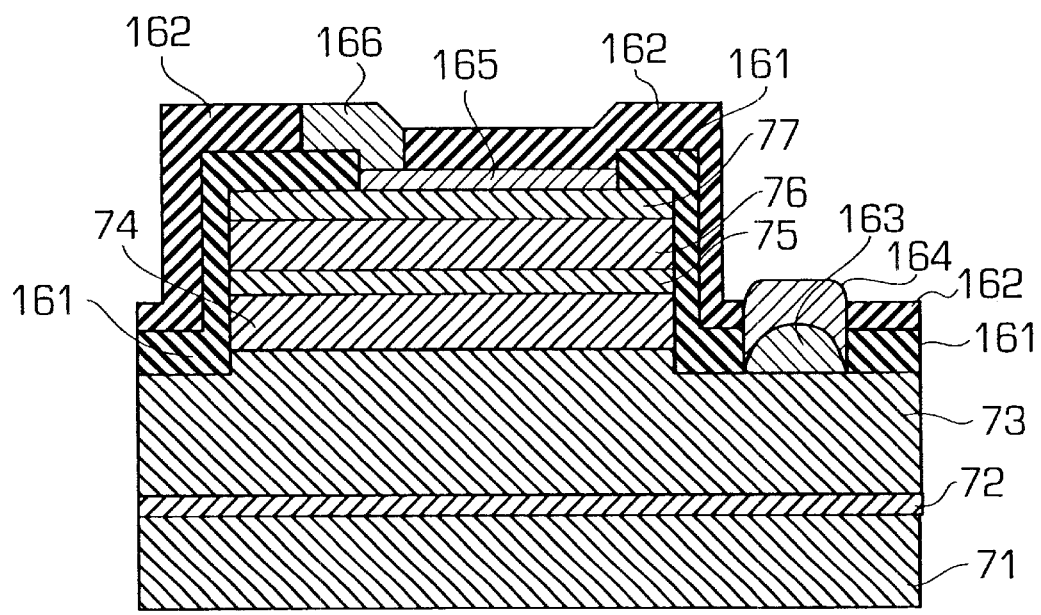
FIG. 7 is a schematic sectional view showing nitride semiconductor light emitting device in accordance with a seventh embodiment of this invention.
Figure 8:
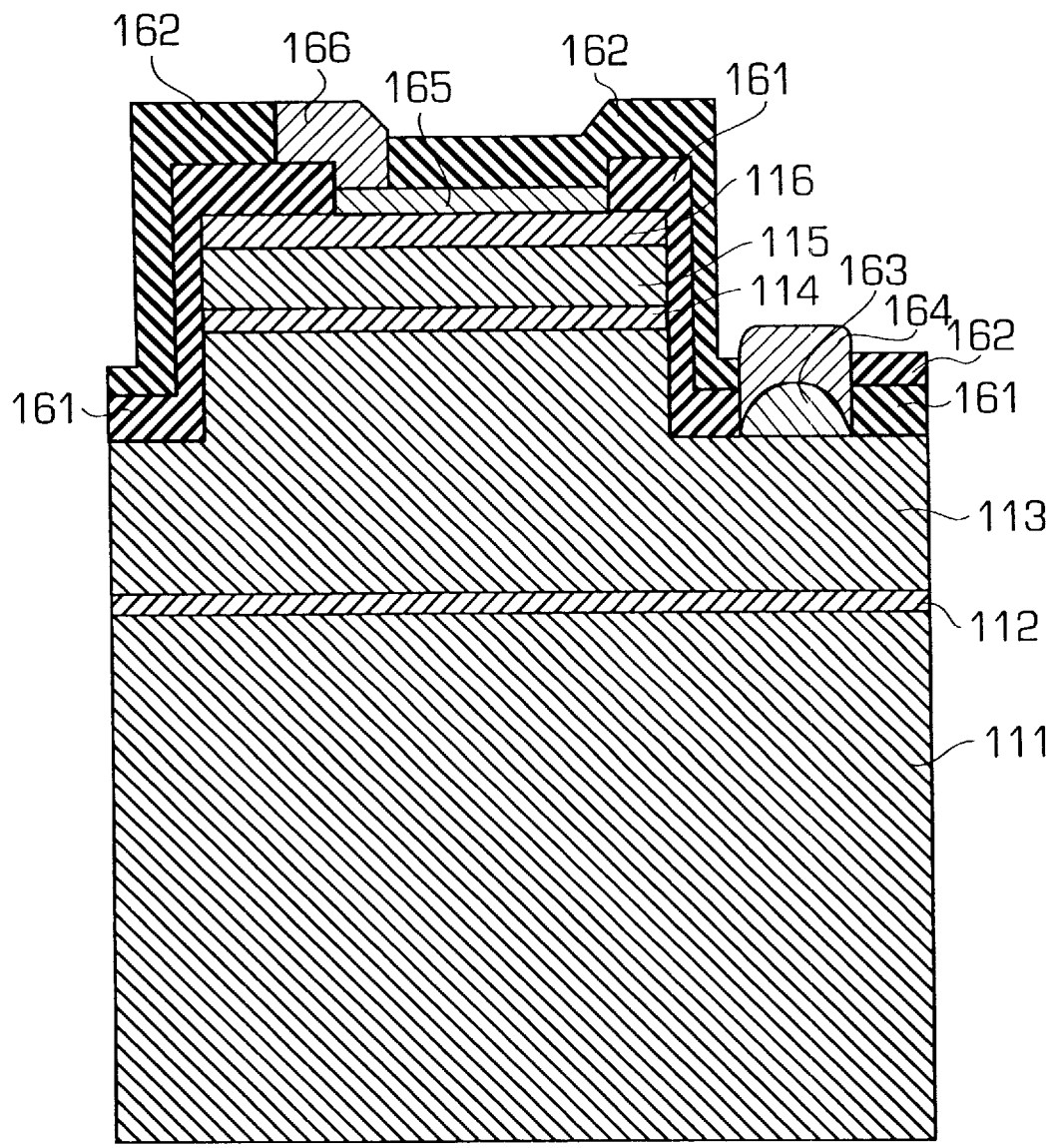
FIG. 8 is the outline sectional view which exemplifies the LED which possesses a traditional contact layer.

FIG. 7 is a schematic sectional view showing nitride semiconductor light emitting device according to the seventh embodiment of the invention. The figure exemplifies cross section structure of LED in which GaN buffer layer 72, n-type GaN (Si-doped) layer 73, n-type BAlGaN (Si-doped) layer 74, InGaAlN active layer 75, p-type BAlGaN (Mg-doped) layer 76, GaAlN/BGaAlN (Mg-doped) modulation-doped superlattice contact layer 77 are stacked in this sequence on a sapphire substrate 71.

The LED shown in FIG. 7 has an active layer 75 which is formed of InGaAlN quaternary compound semiconductors whose bandgap is wide enough so as to emit an ultraviolet lights having wavelength of about 350 nm. The contact layer 77 is formed of materials whose bandgap is wide enough to transmit the ultraviolet light emitted from the active layer. Generally, the contact resistance between he contact layer and the contact electrode becomes higher as the bandgap of the contact layer becomes wider. Present embodiment can solve this problem by employing a contact layer 77 which has a superlattice structure including GaAlN layers and BGaAlN layers, and by selectively doping BGaAlN layers having a wider bandgap. As a result, the contact resistance between the contact layer 77 and the electrode 165 can be effectively decreased while keeping the transparency of the contact layer.

The present invention has been described above with reference to specific embodiments thereof. However, it should be noted that the present invention is not limited to those embodiments.

For example, the present invention can be applied not only to LEDs but also laser diodes (LDs), and thus similar effects can be achieved. The specific structure of these LEDs and LDs of the present invention may have any feature known to the skilled person in the art.

According to the invention, the layers having a higher hardness or having a wider bandgap in the suparlattice contact layer are selectively doped with an appropriate dopant. However, the dopant may diffuse out from these selectively-doped layers to some extent. Especially, magnesium is easy to diffuse in the semiconductors. As a result, the non-intentional doping may take place in the layers having a lower hardness or having a narrower bandgap. Even in these cases, enough effects can be achieved according to the present invention.

As a p-type dopant to be selectively doped into the superlattice contact layer, beryllium (Be), cadmium (Cd), merculy (Hg) and other appropriate elements can be used as well.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

The entire disclosure of Japanese Patent Application No. H11-233009 filed on Aug. 19, 1999 including specification, claims, drawings and summary is incorporated herein by reference in its entirety.

What is claimed is:

1. A semiconductor light emitting device comprising:
a contact layer formed of a nitride semiconductor; and
a p-side electrode provided in contact with a surface of said contact layer,
said contact layer having an alternatively stacked structure of first nitride semiconductor layers having a wider bandgap and second nitride semiconductor layers having a narrower bandgap, said first semiconductor layers being selectively doped with a p-type dopant.

2. The semiconductor light emitting device according to claim 1, wherein said first nitride semiconductor layers are formed of BGaAlN and said second nitride semiconductor layers are formed of GaAlN.

3. The semiconductor light emitting device according to claim 1, wherein said first nitride semiconductor layers are formed of InGaAlN and said second nitride semiconductor layers are formed of InGaAlN.

4. The semiconductor light emitting device according to claim 1, wherein said first nitride semiconductor layers are formed of InGaAlN and said second nitride semiconductor layers are formed of InGaN.

5. The semiconductor light emitting device according to claim 1, wherein said first nitride semiconductor layers are formed of GaN and said second nitride semiconductor layers are formed of InGaN.

6. The semiconductor light emitting device according to claim 5, wherein a content of indium among group III elements in said InGaN is larger than 0% and smaller than 20%.

7. The semiconductor light emitting device according to claim 1, wherein said first nitride semiconductor layers are formed of GaAlN and said second nitride semiconductor layers are formed of GaN.

8. The semiconductor light emitting device according to claim 7, wherein a content of aluminum among group III elements in said GaAlN is larger than 0% and smaller than 20%.

9. The semiconductor light emitting device according to claim 1, wherein said first nitride semiconductor layers are formed of $In_xGa_{1-x}N$ and said second nitride semiconductor layers are formed of $In_yGa_{1-y}N$ (x<y).

10. The semiconductor light emitting device according to claim 1, wherein said first nitride semiconductor layers are formed of GaAlN and said second nitride semiconductor layers are formed of InGaN.

11. The semiconductor light emitting device according to claim 1, wherein a hardness of said first nitride semiconductor layers is higher than a hardness of said second nitride semiconductor layers.

12. The semiconductor light emitting device according to claim 1, wherein said p-type dopant is a element selected from a group consisting of magnesium, zinc and carbon.

13. The semiconductor light emitting device according to claim 1, wherein said p-type dopant is magnesium and its concentration is higher than $1 \times 10^{19}$ cm$^{-3}$ and lower than $1 \times 10^{21}$ cm$^{-3}$.

14. The semiconductor light emitting device according to claim 1, wherein said p-side electrode includes oxide material.

15. A semiconductor light emitting device comprising:
a contact layer formed of a nitride semiconductor; and
a p-side electrode provided in contact with a surface of said contact layer,
said contact layer having an alternatively stacked structure of first nitride semiconductor layers having a higher hardness and second nitride semiconductor layers having a lower hardness, said first semiconductor layers being selectively doped with a p-type dopant.

16. The semiconductor light emitting device according to claim 15, wherein said second nitride semiconductor layers include higher content of indium than said first nitride semiconductor layers.

17. The semiconductor light emitting device according to claim 16, wherein said content of indium among group III elements in said second nitride semiconductor layers is larger than 0% and smaller than 20%.

18. A semiconductor light emitting device comprising:
a contact layer formed of a nitride semiconductor; and
a p-side electrode provided in contact with a surface of said contact layer,
said contact layer having an alternatively stacked structure of first nitride semiconductor layers and second nitride semiconductor layers, said second nitride semiconductor layers including a higher content of indium than said first nitride semiconductor layers.

19. The semiconductor light emitting device according to claim 18, wherein said content of indium among group III elements in said second nitride semiconductor layers is larger than 0% and smaller than 20%.

20. The semiconductor light emitting device according to claim 18, wherein said first nitride semiconductor layers include higher content of aluminum than said second nitride semiconductor.

* * * * *